(12) United States Patent
Cencur

(10) Patent No.: US 6,750,564 B2
(45) Date of Patent: Jun. 15, 2004

(54) COMPACT NON-CONTACT ELECTRICAL SWITCH

(76) Inventor: Marko Cencur, Celovska 122, 1000 Ljubljana (SI)

( * ) Notice: Subject to any disclaimer, the term of this patent is extended or adjusted under 35 U.S.C. 154(b) by 522 days.

(21) Appl. No.: 09/834,226

(22) Filed: Apr. 12, 2001

(65) Prior Publication Data
US 2001/0045803 A1 Nov. 29, 2001

Related U.S. Application Data

(60) Provisional application No. 60/196,359, filed on Apr. 12, 2000.

(51) Int. Cl.[7] .......................... H01H 35/00; H01H 83/00
(52) U.S. Cl. ........................................ 307/116; 327/517
(58) Field of Search .......................... 307/116; 327/517; 340/536.263, 686.6; 211/206; 361/179

(56) References Cited

U.S. PATENT DOCUMENTS

| | | | |
|---|---|---|---|
| 3,697,971 A | 10/1972 | Domin et al. | |
| 4,087,702 A | 5/1978 | Kirby et al. | |
| 4,090,184 A | 5/1978 | Hamilton, II | |
| 4,119,864 A | 10/1978 | Petrizio | |
| 4,192,974 A | 3/1980 | Kiko | |
| 4,323,829 A | 4/1982 | Witney et al. | |
| 4,360,737 A | 11/1982 | Leopold | |
| 4,476,554 A | 10/1984 | Smith et al. | |
| 4,668,877 A | 5/1987 | Kunen | |
| 4,716,274 A | 12/1987 | Galliland | |
| 4,766,368 A | 8/1988 | Cox | |
| 4,831,279 A | 5/1989 | Ingraham | |
| 4,888,673 A | 12/1989 | Droege | |
| 5,063,306 A | 11/1991 | Edwards | |
| 5,199,639 A | 4/1993 | Kobayashi et al. | |
| 5,235,319 A | 8/1993 | Hill et al. | |
| 5,663,633 A | 9/1997 | Kahn et al. | |
| 5,716,129 A | 2/1998 | Kunen et al. | |
| 5,760,688 A | 6/1998 | Kasai | |
| 5,973,608 A | 10/1999 | McMahon | |
| 6,376,939 B1 * | 4/2002 | Suzuki et al. | 307/326 |

* cited by examiner

Primary Examiner—Gregory J. Toatley, Jr.
(74) Attorney, Agent, or Firm—William J. Sapone; Coleman Sudol Sapone, P.C.

(57) ABSTRACT

A compact non-contact electrical switch for use in an electrical box mounted on a wall has a capacitance sensor for detecting a presence of a hand placed adjacent to the switch and for generating a first data bit, and a CPU for receiving the data bit and for calculating a power output in response to the first data bit The CPU generates a control signal for controlling a triac or relay and thus the power supplied to an electrical circuit passing through the box, for on/off and optionally dimmer control responsive to the proximity of the hand.

104 Claims, 7 Drawing Sheets

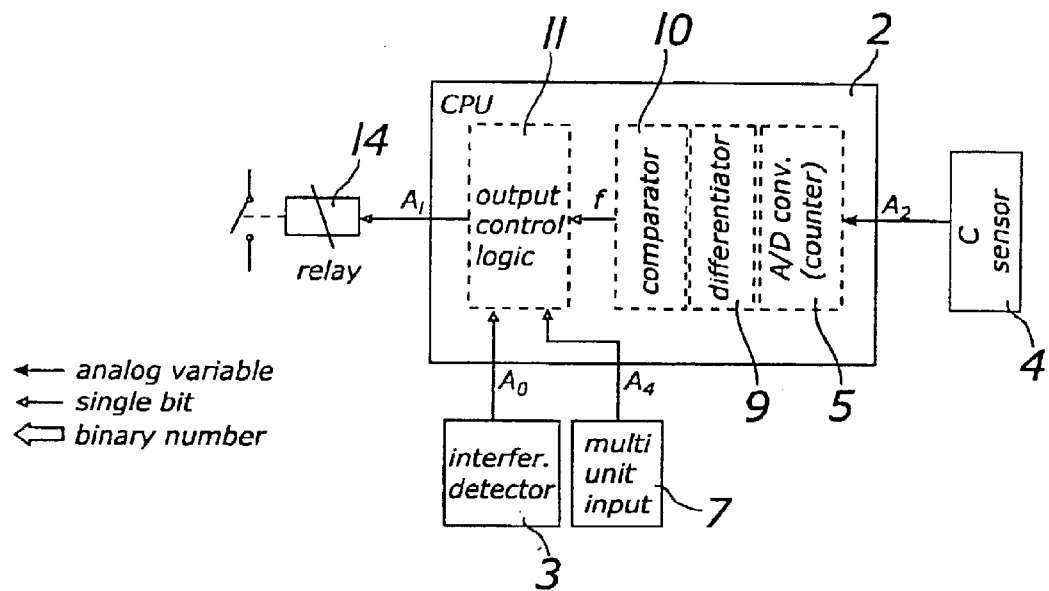
Fig. 4
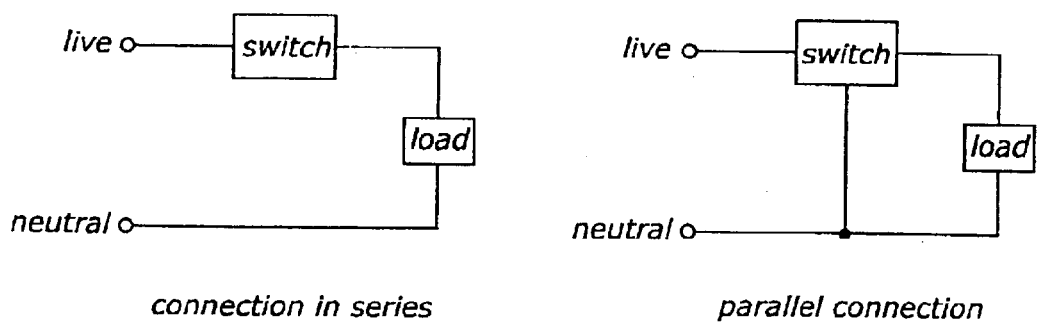
connection in series
Fig. 7a
parallel connection
Fig. 7b

COMPACT NON-CONTACT ELECTRICAL SWITCH

TECHNICAL FIELD

This invention relates to electrical switches and more particularly to a compact non-contact capacitance switch for on/off or on/off/dimmer control of an electrical circuit.

BACKGROUND

Most household or office electrical circuits, particularly those related to lighting, typically utilize mechanical switches. These mechanical switches may be of the contact type for on/off activation, or include a means for varying the power supplied to the circuit, i.e., to perform a "dimming" function, to variably alter power supplied to a light or to act as a speed control for a fan.

Non-contact switches that rely on a change in capacitance to perform an on/off function have been proposed. These devices sense the presence or absence of an object in front of the switch by the change in capacitance.

In U.S. Pat. No. 5,973,6081, a non-contact switching system is described that utilizes selected components to provide on/off and dimming functions. However, the components in one embodiment are preferably housed at a centralized location, requiring dedicated wring from the sensors to the central controller and then back to the activated circuits.

In addition, the dimming function is achieved in defined steps which require particular components for each step, further increasing costs and complexity. For example, the '608 patent uses outputs of a capacitive sensor at predetermined levels to activate different stepped levels of dimmer output. This means that the number of capacitive sensor outputs is proportional to possible dimmer levels. A digital value representing those levels is passed through a programmable logic device (PLD) and then latched. Latch output determines output power level. This means that the number of power control outputs is proportional to the output power levels. To construct a smooth dimmer, small increments in output power level are needed, which requires a proportionally high number of power control outputs, and thus multiple large components with a high number of pin counts (PLD, latch, clock chips). Even if a CPU were considered for use in the device, the input pin count would still be equal to the sensor output number and the output pin count equal to the latch output number of the CPU, which would still be proportional to the number of stepped dimmer levels, requiring a large CPU chip and numerous interconnections and peripheral components in the circuit.

Control of the '608 switch is hand movement dependent. To switch the light on, the band must be moved from the furthest zone into the closest zone of the sensor. To switch the light off, the hand must be pulled from the closest zone into the furthest zone of the sensor. Clearly two different types of movement are needed for basic operation of the switch. To users unfamiliar with the device this could result in confusion.

In U.S. Pat. No. 5,716,129, a non-contact switch includes an oscillator having a frequency output that varies with proximity of a hand. The components are intended for insertion into a lamp base or an ornamental shell. The component count and/or component size are quite large and would not fit into a standard wall box, as is clear from the view showing these components in a lamp base, and this is without a dimmer control circuit. The device is clearly not capable of functioning as a direct replacement of a mechanical wall mounted switch. The device also requires both a neutral and a live connection to the AC power source, while in many wallboxes and circuit designs, only one lead is accessible, rendering such a device useless as a direct replacement.

A particular problem with the prior art is the inability to provide a direct replacement for a mechanical switch. For example, a direct replacement of a mechanical on/off toggle switch must be capable of fitting within a space defined by a common electrical box. Utilizing special size boxes or special wiring adds substantially to the cost of installation, and is prohibitive in any retrofit application.

SUMMARY OF THE INVENTION

It is an object of the present invention to provide a non-contact proximity type switch for controlling an electrical circuit.

It is a further object to provide a non-contact capacitance electrical switch that has a compact integral construction, only requiring connection to conventional wire leads for mounting in new or existing wall boxes.

It is yet another object of the present invention to provide an integral compact non-contact electrical switch that has a minimum number of components to reduce costs and improve reliability.

These and other objects of the present invention are achieved by a non-contact electrical switch for use in an electrical circuit for controlling an electrical device comprising:

a capacitance sensor;

means for detecting an AC period zero crossing;

a central processing unit (CPU) connected to the capacitance sensor and having means for receiving a signal therefrom, and for processing the signal to generate an output signal, and having signal processing means for receiving the output signal and calculating a power output in response thereto relative to the AC period zero crossing, and for generating a control signal used for controlling power in the electrical circuit.

In one embodiment, the output signal may generate a triac firing pulse, a delay between the AC period zero crossing and the firing pulse determining the quantity of power delivered to the circuit.

Preferably, the non-contact electrical switch includes an interference detector which generates a signal that is received by the CPU to avoid inadvertent activation and/or to zero out electromagnetic and line interference, for example caused by lightning, faulty electrical appliances, etc.

The inventive switch uses a capacitance sensor to control a power supply to the electrical circuit. The capacitance sensor detects the presence of an object in front of the switch, turning the power on/off or performing a dimming function. The sensor reacts to the change of capacitance, caused by the change of dielectric constant of the medium in front of the sensor. The switch only reacts on a capacitance change rather than on fixed capacitance values. Advantages of such a design over prior non-contact switches such as capacitance, infra-red, sound, light sensor, movement to detector etc. are:

1) Switch control is independent of the front plate material, color, shape etc., as there is no need to conduct a physical contact control signal via a conductive element (for example as with a touch plate sensor).

2) There are no accommodations necessary to accept mechanical limitations to the front plate design as there are no moving parts, unlike mechanical toggle switches and mechanically controlled dimmers.
3) The capacitance sensor can penetrate through various materials, so there is no need for an opening in the front plate for the sensor to operate, unlike infra-red or various sound, light, and motion sensors.
4) The front plates are freely interchangeable since the switch is capable of recalibrating to each new material fixed in front of it.
5) The switch is immune to dirt or grime on the front plate, unlike touch plate sensors, IR and other optical sensors, since any amount of dirt is treated by the capacitance sensor as a fixed object and calibrated out.
6) The switch can be completely sealed since it doesn't incorporate any mechanical moving parts, unlike mechanical switches and mechanically controlled dimmers, which also increases reliability.
7) The operation of the switch is completely spark-free.

A wide range of front plate designs from simple plastic to artistic ceramic could be used with the switch. All natural materials such as stone, crystal, wood etc. or other materials such as plastics, glass, ceramics, rubber etc. could be used for the front plate. There are virtually no limitations except as to maximum combined weight. The switch can be used with various front plate designs purely for decorative or aesthetic reasons, but it could also be used when physical contact with a switch is not desired, for example, when operating a switch in a hospital, public lavatories etc. or where the environment contains dust, dirt etc that may accumulate on the front plate. Since the switch can be sealed, it can also be used in harsh environmental conditions such as when exposed to the elements, to mist or fumes etc., and thus it is applicable to outdoor and/or industrial uses.

The switch can directly replace a standard household wall switch. That is, it can be fitted into an existing wallbox of standard dimensions and be connected to the existing wiring, allowing direct retrofitting in existing electrical circuits. The switch can be connected either in series (i.e. a two-wire connection) as a direct replacement of a regular wall switch where only a single lead is accessible, or in parallel (i.e. a three-wire connection) if the load requires such connection and the wires are accessible in the wallbox. The switch can be provided as a full range smoothly operated dimmer control as well as an on/off switch.

The switch can readily be designed to meet all international standards. Because it is of compact integral construction, substantial space remains in the wallbox beyond that needed by the switch itself, so there is enough room left in the wallbox for wiring. In addition, a metal cooling surface or other heat sink can be incorporated into the switch so as to comply with various heat dissipation standards.

Another advantage of the present invention is that it does not use absolute predetermined values of capacitance to control the switch. With the '608 Patent device, to turn the switch fully on, the hand has to come into the closest zone to the sensor. Since this zone is fixed, it could be inside the wall, for example if the sensor is mounted too deeply into a wall recess or if the sensor is covered by a cover plate that is too thick. In both cases it would be impossible to turn the switch fully on since the closest sensor zone would be inaccessible. A similar problem could occur if a permanent conductive object were mounted near the '608 sensor. This surface would distort the electrical field of the sensor resulting in reduced sensor sensitivity, as zones become closer to the sensor surface. Both problems could possibly be overcome by setting the sensor parameters manually or automatically. If the sensor parameters are adjusted manually, each user of the switch would be responsible for these settings, which is a significant drawback since this would complicate installation. For automatic sensor adjustment, special circuitry must be added to the sensor since the '608 device is not capable of auto-calibration, increasing component count and overall device size and complexity.

In the inventive switch, this problem is solved by reacting on the capacitance change rather than on the absolute value. The flag for detecting the presence of an object is set when capacitance in front of the sensor is increased. There is no fixed predetermined level at which presence is detected. By this the switch is also self-calibrated, as it cancels out any permanent capacitance changes in front of the sensor. This auto-calibration may be implemented completely in software without any increase in component count or in the size of the inventive switch.

The present invention operates independent of hand speed and no special moves are necessary in front of the sensor to activate the basic function of the switch. It always changes the state if the hand is put near the sensor.

BRIEF DESCRIPTION OF THE DRAWINGS

FIG. 4 is a block diagram of an alternative embodiment of the present invention.

FIGS. 7a and 7b are views showing the inventive switch with series and parallel connections.

DETAILED DESCRIPTION OF THE INVENTION

To construct the inventive switch for use in a standard wallbox and to meet all international standards, the switch must be as compact as possible. The number and size of components must be minimized, as well as the number of data lines between elements of the circuit and the space occupied by inter-component connections to reduce the number of chip-pin count, reducing chip size.

Some of the elements used in the switch (triac, snubber capacitor for triac, filter choke, power supply, fuse) are basic and are conventionally used in many types of electronic devices. Since they are quite bulky, they also would normally decrease useful space for specialized electronic parts such as the capacitive sensor, control circuitry, back lighting, etc.

In the present invention, a compact integral design is achieved by detecting only the presence of an object such as a hand placed in front of the sensor rather than its position relative to the sensor. This produces only one bit of input data, referred to as a "flag". Control of power delivered by the switch is accomplished via a delayed triac trigger pulse, so the output data consist of only one output bit. This results in a very compact design, using only three data bits, the input from the sensor, output to the triac and an input from an AC zero detector, independent of a dimmer level count.

Figure 1:
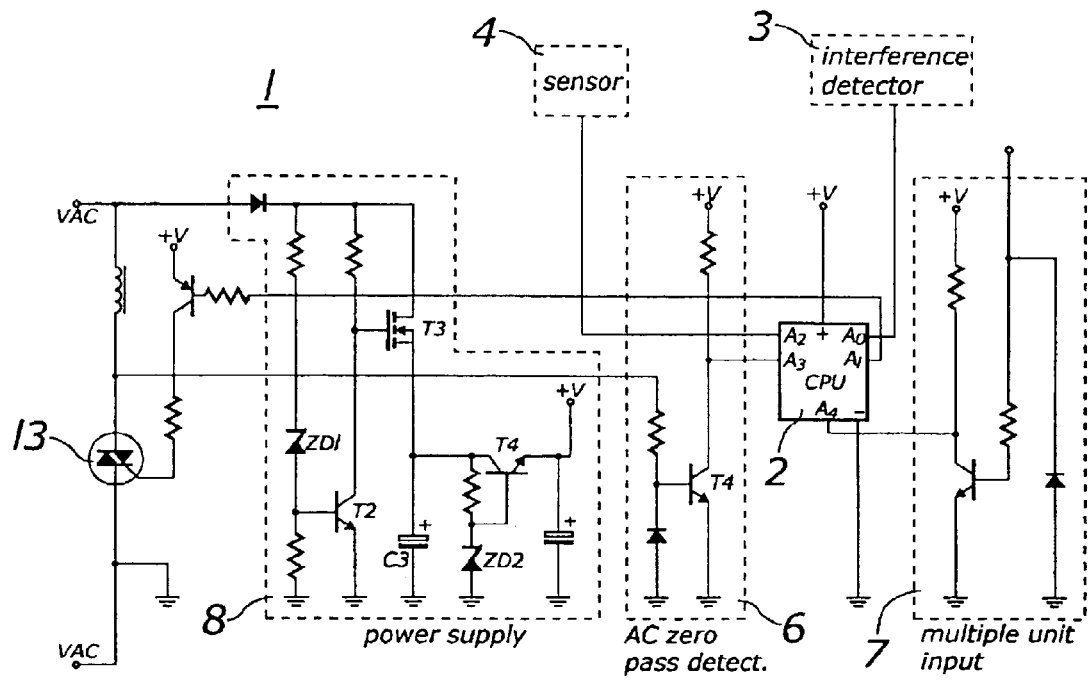
FIG. 1 is a schematic of an integral non-contact switch of one embodiment of the present invention.

Referring to FIG. 1, a schematic view of a non-contact switch 1 according to the present invention is shown. The non-contact switch circuit is shown divided into several functional blocks.

A CPU 2 is the central block and has four inputs and one output.

Pin $A_0$ can be configured as an input or an output and is connected to an interference detector 3. Pin $A_0$ is configured as an output only momentarily when the interference detector is reset. The rest of the time this pin is configured as an input. The CPU 2 uses this input to periodically check for an interference. If input is one, an interference has been detected since the last reset of the interference detector. If the input is zero, no interference has been detected. If the interference is detected while the CPU is measuring an output from sensor 4, the value obtained by the CPU is discarded. The interference detector is reset before starting the sensor measurement cycle.

Pin $A_1$ is an output which generates a triac firing pulse. A delay (or time passed) between AC period zero crossing and the firing pulse determines a power delivered to a load. If the delay is zero, power is maximal. If the delay is ½ of AC period, power is zero. In practice both extreme values for the delay are not used. If the triac is not fired (firing pulse is absent) the power delivered to a load is zero. By this the switch is turned off.

Pin $A_2$ is an input from the sensor 4, fed to a counter 5 in the CPU 2 which counts pulses in a predetermined fixed time. By this, a frequency of a sensor output is converted into a binary number. Another way to convert sensor output frequency into a binary number is to count pulses of predetermined frequency within each period of the sensor signal, and the invention is not limited to one method of conversion.

Pin $A_3$ is an input from a AC zero crossing detector 6. Via this input, the CPU is synchronized with the AC period.

Pin $A_4$ is an input, optionally used when a multiple unit input circuit 7 is used to connect multiple units to control a single load. One switch is made master to control the power to the load, the other switches being slaves connected to this master input.

A power supply circuit 8 completes the assembly.

Figure 2A:
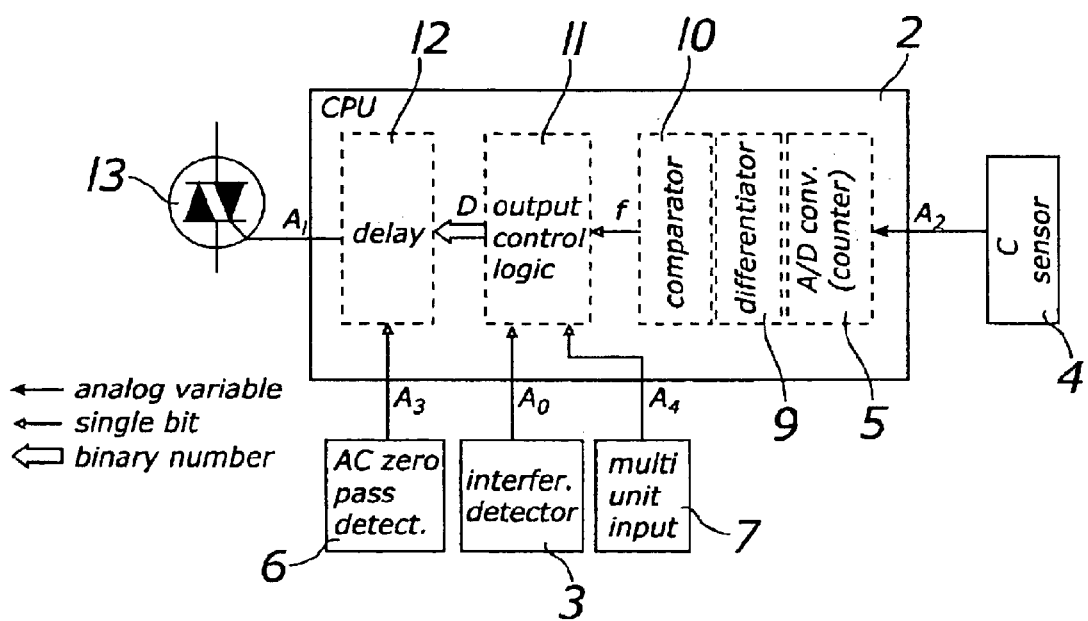
FIG. 2a is a block diagram showing the components of the non-contact switch.

Referring to FIG. 2a, the non-contact switch is illustrated by a block diagram. An input from a sensor 4, which may be a frequency signal, is converted in the A/D conversion counter 5 to a digital value. This digital value is passed through a differentiator 9. Because of the differentiator, the switch only reacts on capacitance changes, the differentiator canceling out any permanent objects in front of the sensor, thereby providing a self-calibration of the switch. An output of the differentiator is than passed to a comparator 10 which checks to confirm if the differentiator output is large enough to overcome a threshold level. An output of the comparator is flag $f$. If an object such as a hand is present in front of the sensor, flag $f$ is set. If the object remains in front of the sensor, the differentiator output slowly declines. The rate of output decline depends on the differentiator time constant. If the object remains in front of the sensor long enough for the differentiator output to decline below the comparator threshold, flag $f$ is reset. If for example the hand is in front of the sensor for several minutes, the switch only reacts to it for several seconds. The differentiator time constant determines how long the switch reacts to the fixed hand. If the constant is increased, the switch reacts longer to the fixed object and vice versa. After that, the switch is recalibrated to a new value and stops reacting. The switch will only react again if the hand is removed and then put in front of the sensor again or if another object is added to the hand in front of the sensor. Two different time constants can be utilized in the differentiator, one for when the input value is increased and one for when the input value is decreased. The differentiator reacts differently when the object is put in front of the sensor and when it is removed. When a fixed object is put in front of the sensor, the first time constant determines for how long flag f will be set i.e. the time for the switch to calibrate when an object is put in front of the sensor. The other time constant determines how long it takes for the switch to recalibrate when the object is removed. Both constants could be equal but sometimes it may be preferred that the second time constant be much lower than the first one so that the switch is calibrated more slowly if the hand is put in front of the sensor, giving adequate time to activate and operate the dimmer. When the hand is removed, the switch is calibrated much faster and full differentiator output swing is available when the hand is put in front of the sensor again. Since the differentiator is made in software, various algorithms could be used to calculate the differentiator output to optimize the switch operation.

Flag $f$ is then fed to an output control logic component 11. This logic component calculates the power to be applied as a power output as a function of flag $f$. The output of this component is a digital value D, which determines the power delivered to the load. The output value D of the output control logic is fed to a delay counter 12. This counter is synchronized with the AC period via the zero cross detector, to generate a time delay after AC period zero crossing which is proportional to the digital value D. This delay determines the amount of power delivered to the load. If the delay is zero, the power is maximal, if the delay is ½ of AC period, the power is zero. The output from the delay control controls a triac 13. There are many possible algorithms for calculating the value D as a function of flag $f$. One of these possibilities, where an output (D) is a function of flag $f$ is shown in FIG. 3 and described below.

Figure 3:
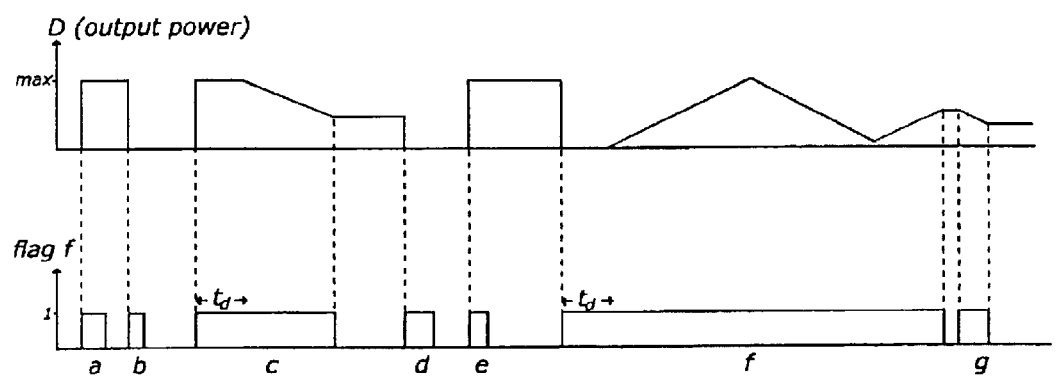
FIG. 3 is an illustrative view of the control output (D) as a function of the flag (f).

Referring to FIG. 3, when flag $f$ changes from zero to one, the output is toggled. If the output is zero, it is set to the maximum, if the output is non-zero, it is set to zero. If the pulse is shorter than time constant $t_d$ (pulses a, b, d and e on FIG. 3) no further action beside output toggling is taken. If the pulse is longer than a time constant $t_d$, the dimmer function is activated beside output toggling. If the output is maximal after toggling, it starts to decrease (pulse c), if the output is minimal after toggling, it starts to increase (pulse f). If the pulse is long enough for the output to increase to the maximal output level (or decrease to the minimal level) the direction is changed. The output slowly oscillates in a saw-like pattern until flag $f$ is reset.

If the dimmer is active, i.e., the output is being increased or decreased, and flag $f$ is zero for a short duration and then one again (shown as the pause between g and f), the switch will only change the direction of the dimmer rather than toggle its output. By this the dimmer output can be fine tuned by trimming it up and down to a desired output. But if flag $f$ is zero for a time interval longer than a predetermined value, shown as pulse d after c, the output will toggle its state.

The algorithm for calculating the output of the switch as a function of flag $f$ can be made completely in software, as opposed to being burned in as firmware incorporated in the chip, if desired, so as to allow use of different algorithms without a change in chip size and component count. There are an infinite number of possible algorithms for calculating $D(f)$. One of these could simply be a push-button function: the output being maximal only when flag $f$ is one and zero the rest of the time. Another algorithm could be a simple switch without a dimmer where the output toggles with each zero to one transition of the flag $f$.

Referring to FIG. 4, alternatively the output control logic can provide a relay activation signal. If this signal is 'one', a relay 14 is activated, if the signal is 'zero' the relay is not activated. The state of the output toggles with each zero to one transition of flag $f$. There is no need for the delay timer, if a relay is used. Again, this change may be incorporated in software for the CPU, so this alternate embodiment would not change chip size or component count.

The AC zero pass detector is used to synchronize the CPU with the AC period. A transistor $T_5$ conducts on a positive halfwave of the period and is off on a negative halfwave. The CPU detects a period zero pass by detecting a transition on the $A_3$ pin. Of course, there are many possible zero detector topologies known in the art which can be used in the inventive switch.

Referring again to FIG. 1, the power supply unit, illustrated as block 8 is used to supply power to the switch circuit. There are also many possible topologies for this, and any of these can be used provided that enough power is supplied to the switch for continued operation in the worst case scenario, such as when the unit is connected in series with the load and the switch is turned fully on and AC line voltage is minimal. The power supply unit has to provide power when the switch is connected in either parallel (three-wire connection) or series (two-wire connection), such as illustrated in FIGS. 7a and 7b. When connected in parallel, the power is obtained directly from the AC power with a separate power connection. When the switch is connected in series with the load, the power is derived from the voltage drop on the triac. When the switch (triac) is fully on, the voltage drop on the triac is very low. Obtaining enough voltage from voltage drop on the triac could be difficult when the switch is connected in series with the load and turned fully on, which is the way the vast majority of normal household switches are connected. Consequently, a preferred power supply unit is configured as follows. If the AC line voltage is in a positive half-wave and below 15V (or some other predetermined low voltage), a transistor $T_2$ is closed, leaving a gate of $T_3$ on a positive potential. $T_3$ is in a conductive state, connecting a capacitor $C_3$ to the line voltage and charging it. When the line voltage increases over 15V (or some other predetermined low voltage), a zener diode $ZD_1$ conducts, and $T_2$ opens. This connects the gate of $T_3$ to ground, and $T_3$ stops conducting. In other words, when the line voltage is in a positive half-wave and lower than 15V, the capacitor $C_3$ is connected to the line voltage and charged. When the voltage increases over 15V, $C_3$ is disconnected from the line voltage. The voltage on the capacitor $C_3$ is further regulated by $T_4$ and $ZD_2$.

This supplies a smooth constant voltage with low AC line voltages even when the unit is connected in series and turned fully on. Another advantage is that it avoids large high voltage capacitors or large high wattage resistors, as would typically be found in such a circuit, thus keeping the overall size of the switch small and compact. Such a power supply could also be used to supply current large enough to drive LEDs or small light bulbs for back-lighting the switch plate. Of course, other topologies could be used to directly couple a capacitor to the line voltage and charge it, while the line voltage is low enough.

The interference detector 3 may be a simple two state circuit (flip-flop) that is reset by the CPU (when $A_0$ is set as an output) and set by any eventual line or EM interference. The output of this circuit can be read by the CPU (when $A_0$ is set as an input). If this circuit detects an interference in the CPU sensor signal measurement cycle, the value obtained by this measurement can be inaccurate. In other words, if this block detects an interference when the CPU is measuring the sensor input signal, the CPU discards the measured value. The interference detector improves noise immunity, but this is optional for the switch operation since purely software routines can be incorporated in the CPU to improve noise immunity.

Some possible software routines that can be incorporated in the CPU to improve noise immunity include:

Counting 'valid' measurements. Flag $f$ is set to one only after a predetermined number of 'valid' measurements. The measurement is 'valid' if it would set flag $f$. This means that some number of measurements must be able to set flag $f$ for flag to be actually set. For example, let the value of required 'valid' measurements be three. The first value is measured, differentiated and compared and set to a valid measurement counter 15. If the differentiator output is large enough for flag $f$ to be set, the 'valid' measurement counter is set to value one but flag $f$ is not set. Then another value is measured, differentiated, compared. If the differentiator output for this second value is also large enough for flag $f$ to be set, the 'valid' measurement counter is incremented to value two, but flag $f$ is still not set. The next value is measured, differentiated and compared. If the differentiator output for third value is also large enough for flag $f$ to be set, the 'valid' measurement counter is incremented to value three and flag $f$ is finally set. If the differentiator output for any of the three measurements would be too low to set flag $f$, the 'valid' measurement counter would be set to zero. Three 'valid' measurement in series would be needed to actually set the flag, eliminating one or more nonrepetitive erroneous sensor measurements due to temporary interference.

Figure 2B:
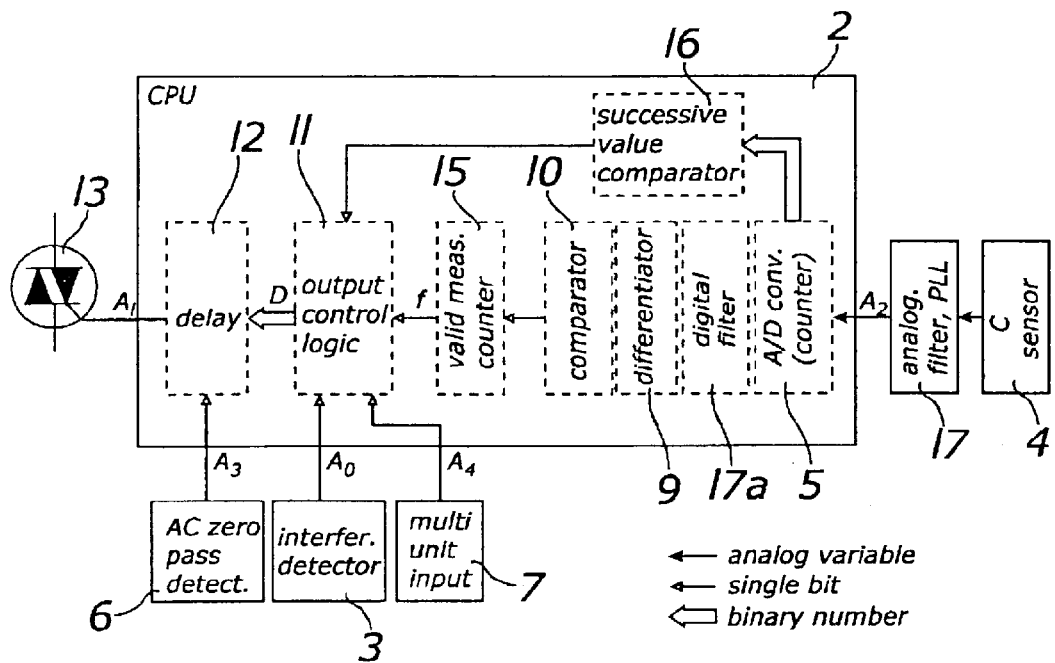
FIG. 2b is a block diagram showing alternative embodiments of the present invention.

Eliminating measurements that differ too much. An object such as a hand is moved towards the sensor in a finite time. This time is usually much larger than the time passed between two successive measurements. Therefore, many measurements will be taken for a single hand movement even when the hand is moved quickly. Consequently, the series of measured values could be compared to each other to detect an anomaly in a comparator 16. For example, the hand moves incrementally between measurements, the sensor output should only change in a correspondingly small increment. If the difference between a previous measured value and a current measured value is too large, for example, increasing by 100% as opposed to an expected incremental change of 10%, the large difference is interpreted as interference and the current value is discarded Filtering. Another method for reducing noise interference is to place an analog filter 17 between the sensor output and the CPU input, to remove temporary variations in the analog signal, to smooth out the signal. The type of filter depends on the type of analog signal used for the sensor output. In the case of a frequency sensor output, a band-pass filter or PLL (phase locked loop) could be used. In the case of a DC voltage signal, a low pass filter could be used. This filter could be implemented as a digital filter 17a inside the CPU, located between the AD converter and the differentiator as shown in FIG. 2b. Of course, digital implementation of the filter or PLL does not increase component count or switch size.

The multiple unit input optionally allows multiple switch units to be connected to control a single electrical circuit, for example, a room light. One switch is made master for controlling the light, other switches act as slaves which are connected as input signals to the master. Slaves only pass information about slave sensor status to the master and do not control the light directly. This may be used in a room with multiple doorways, the master located by one door and the slave units located by the other doors. The illustrated block in FIG. 1 performs simple signal conditioning, as the signals from the slave units are fed to the CPU. This is of course optional for switch operation, but illustrates the flexibility in use and control achieved by the inventive switch which has enhanced functionality over prior art switches.

In one embodiment of the invention, a slave unit can be connected to the master via a two wire connection, one wire connected to the multiple unit input, multiple slaves connected in parallel on the same two wires. The slave(s) can receive power and send sensor information via this single pair of wires. Using only two wires enables replacement of existing multiple switches which control the same load using existing wiring. No additional wiring is required.

The sensor 4 provides an analog signal related to the dielectric constant of the medium in front of the sensor. If the dielectric constant is changed, the signal changes correspondingly. Changes should of course be large enough to be measurable. In a preferred embodiment, the sensor is an oscillator with an output signal frequency inversely proportional to the dielectric constant of the medium in front of the sensor. Other types of analog signals could also be used (frequency, DC voltage, pulse width, etc.)

Optionally, back-lighting LED's or low power light bulbs could be added to the switch to back-light the front plate from behind. The LED's or light bulbs could be of different color and could vary in intensity. The function of these LED's and light bulbs could be purely decorative or be used to indicate various switch functional states, or both. For example, blue, red and green LED's could be mounted behind the front plate. As these LED's would vary in intensity, an entire spectrum of color combinations can be achieved. Different colors can correspond to different dimmer settings or the color can slowly change by it self for decorative purposes. The front plate can be transparent or semi-transparent to show these color variations through the front plate, or can have openings or windows through which the light would emerge. Various effects can be achieved by this method. If the front plate is made for example from materials which reflect light in an interesting way (for example using some transparent crystalline structures), this would have an effect of the front plate changing its color across the entire color spectrum. By choosing mounting locations, number and color of these LED's or light bulbs, combined with numerous front plate materials and shapes, infinite combinations of effects can be achieved. Of course, a single LED or light bulb can be used in this way to back-light the front plate of the switch when the switch is off to mark the location of the switch in the dark.

Figure 5:
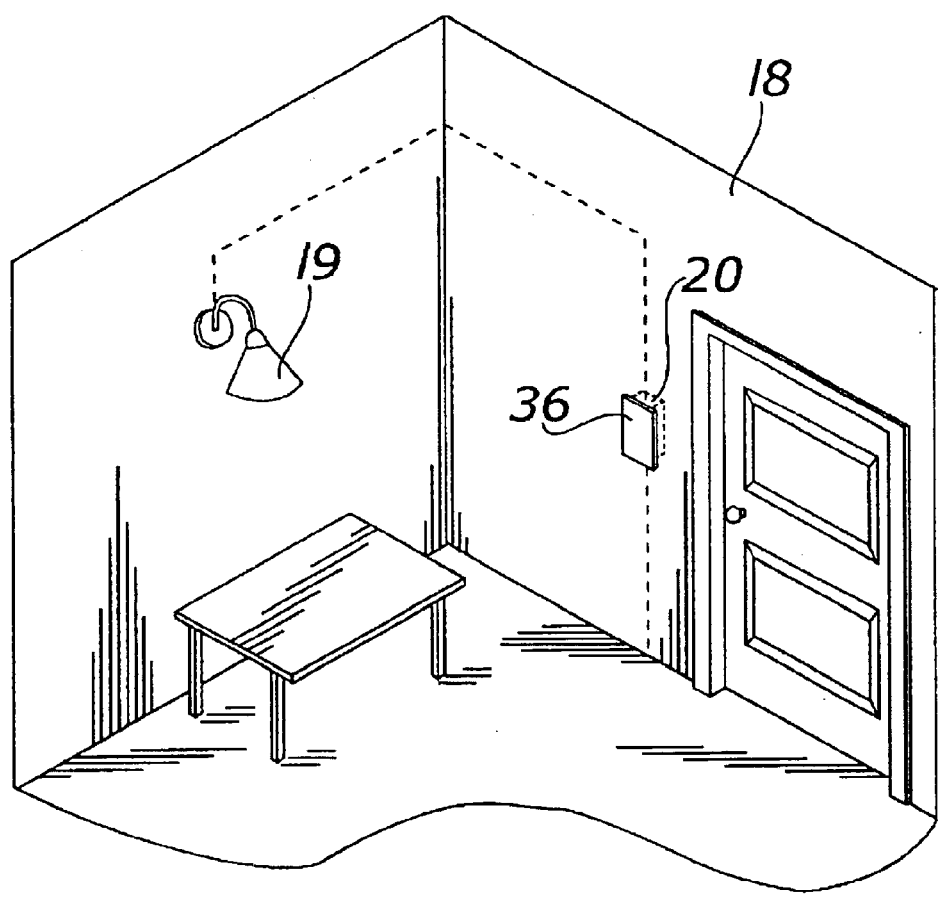
FIG. 5 is a view illustrating operation of a room light in accordance with the present invention.
Figure 6:
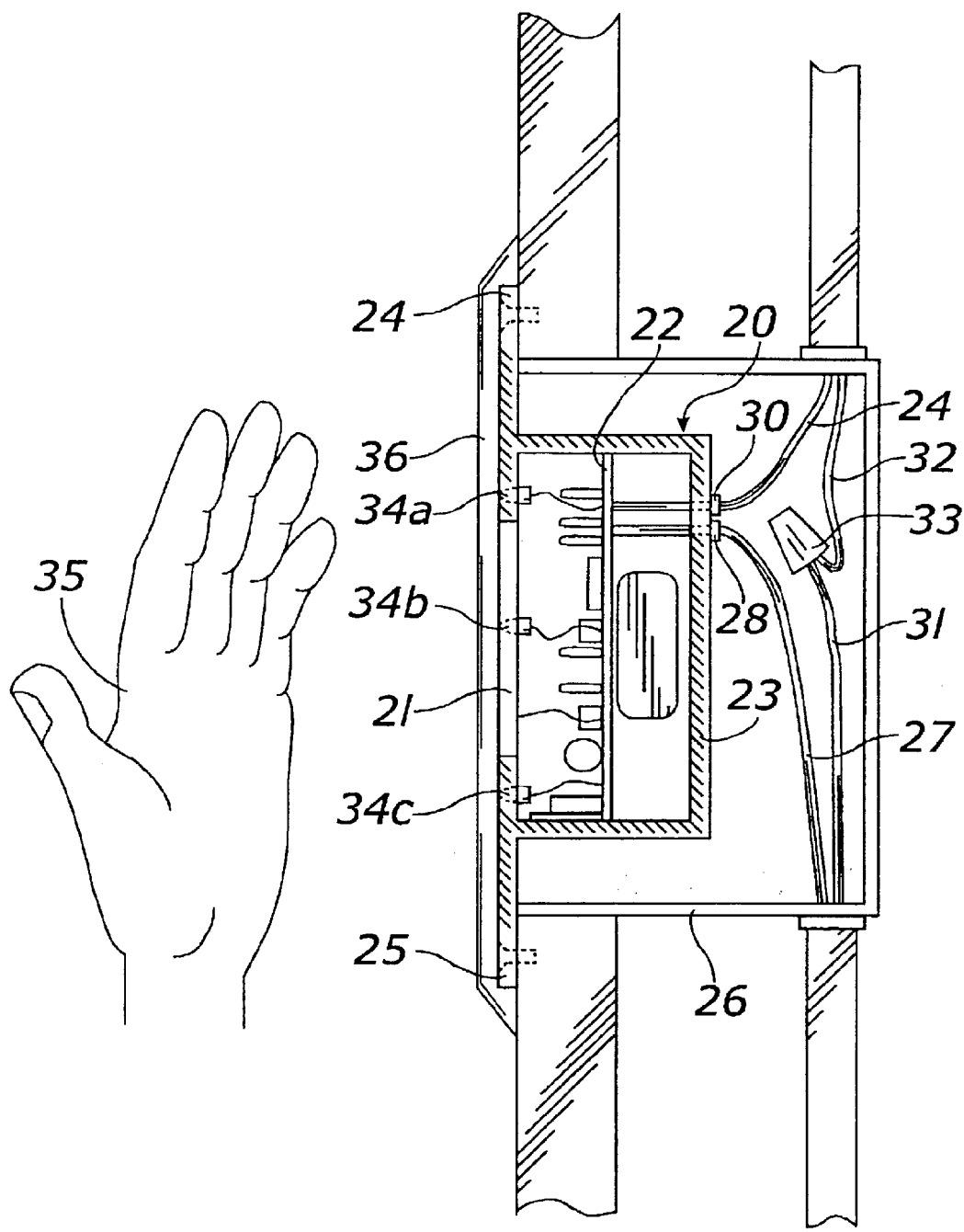
FIG. 6 is a cross section view showing the integral non-contact switch mounted in a switch electrical box.

Referring to FIG. 5, a room 18, has a light 19 wired to a switch 20 located behind a cover plate 36. Referring to FIG. 6, the switch 20 is shown in cross section, the switch 20 has a sensor 21 connected to a circuit board 22 that contains the CPU and other components identified in FIG. 1, located in a housing 23 that has mounting legs 24 and 25 for attachment to a standard electrical box 26. An input lead 27 is received in a connector 28 and an output lead 29 is received in a connector 30. A pair of neutral leads 31 and 32 are received in a wire nut 33. The cover plate 36 is disposed over the switch 20. Three LED's are 34a, b, and c are located on a front surface of the housing, behind the cover plate.

In operation, a hand 35 is placed in front of the switch to activate the switch for on/off or dimmer control as described above, changing the state of the light from on to off or visa versa.

Some standards for electrical switches require an additional air gap switch to be incorporated into the switch, the air-gap switch being accessible to the user without removal of the cover plate, so that the air gap switch inside the device can be operated with the decorative cover plate in place. Of course a mechanical air gap switch could be used with the inventive switch. However, if it is preferred to retain some of the advantages of the invention, particularly to avoid using holes in the cover plate or levers sticking out of the switch, one solution is to operate the air gap switch via movement of the entire decorative cover plate. This movement could be for example rotational, vertical, horizontal, rocking or any combination and variation of those movements. The air gap switch could also be controlled via removal or attachment of the cover plate i.e., push pull action acting on the cover plate. For example, if the decorative cover plate is removed, the air gap switch is off and when the cover plate is attached, the air gap switch is on (or vice versa). In other words, the entire decorative cover plate acts as the actuator for the mechanical air gap switch.

In some cases it is useful to control the switch via a remote control device or to exchange information between switches. Such systems are becoming more practical and are being considered for or included in new "smart" construction buildings. This may utilize special communication wire connecting all communicating devices, or more preferably use the existing AC power lines to exchange information between the switch and a central control unit or between switches. The inventive switch can be integrated into such systems and be programmed and/or controlled via this communication or simply could send information on status. Various protocols and method of transmitting/receiving the information between units via the AC power line could be used. Radio or IR protocols could also be used for transmissions between units.

Figure 8A:
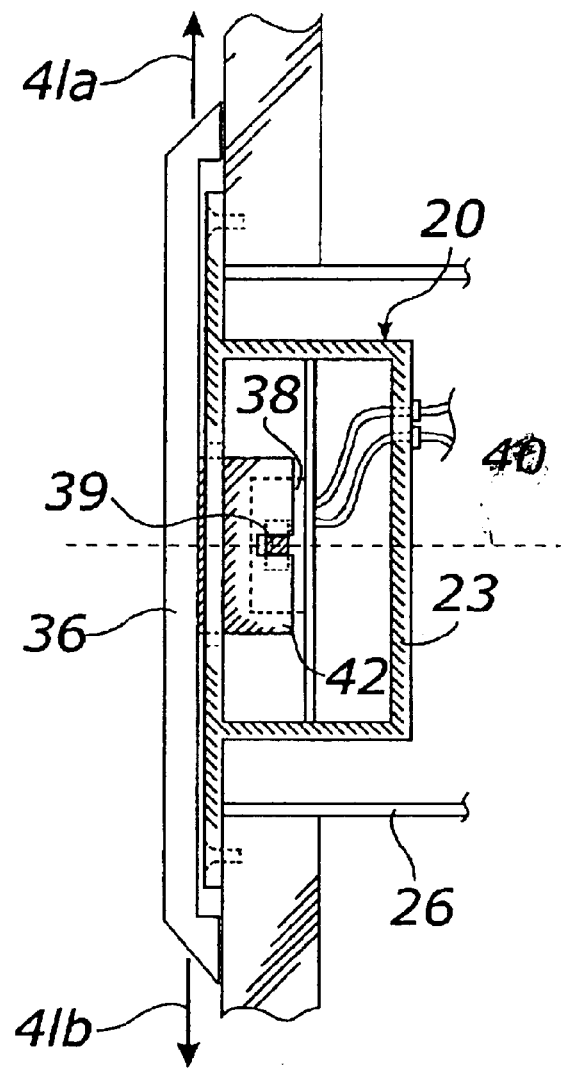
FIGS. 8a and 8b are views of the inventive switch in an embodiment incorporating an air gap switch.

FIG. 8a is a cross section view showing one embodiment of an air gap switch 38. The air gap switch is operated by movement of the cover plate 36. When the cover plate 36 is moved up as illustrated by an arrow 41a or down as illustrated by an arrow 41b, a connecting element 42 correspondingly moves an air gap switch actuator 39. When the cover plate 36 is moved up, the air gap switch actuator 39 is also moved up, when it is moved down, the actuator 39 is moved down. By this the air gap switch 38 state can be changed via movement of the cover plate 36.

Figure 8B:
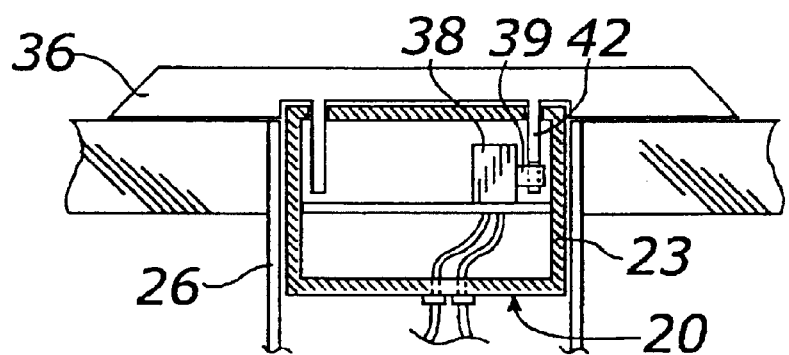

Referring to FIG. 8b, the cover plate 36 has the elements 42 engaged to the switch actuator 39. Of course, there are different ways to translate movements of the cover plate to the switch 38, and the one shown in FIGS. 8a and 8b is merely illustrative. Different kinds of air gap switches with different actuator arrangements could also be used. The air gap switch can be connected so as to control the load directly and thus any unnecessary or duplicative components of the inventive switch can be omitted.

Figure 9A:
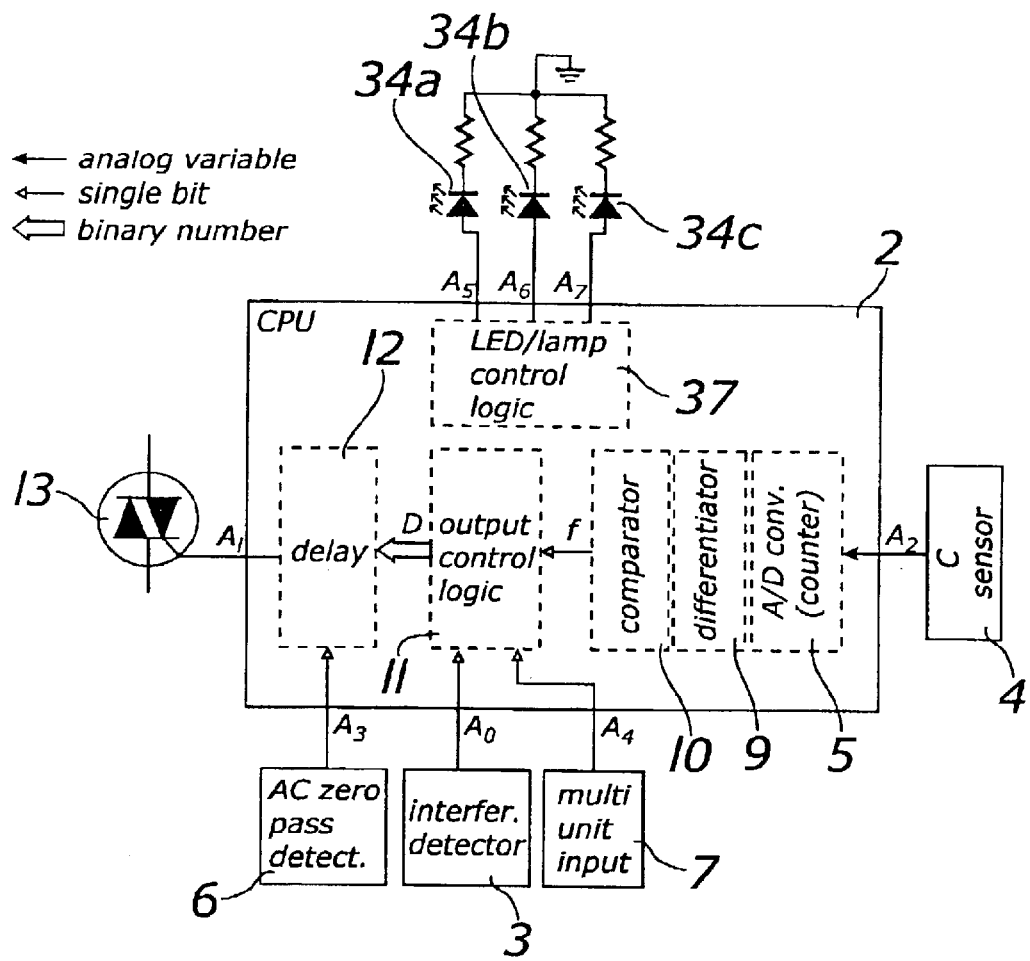
FIGS. 9a–9d are views of yet another embodiment of the invention, incorporating lamp control logic.
Figure 9B:
Figure 9C:
Figure 9D:
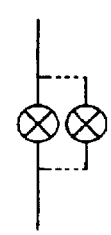

FIG. 9a is a block diagram of an alternative embodiment of the invention. The CPU 2 has a control block 37 that calculates control signals for three light sources 34a, 34b, 34c, which in this case are LED's. These control signals can be calculated using data from other information processed or accessible in the CPU 2, such as the A/D output, output control logic, flag f etc. or without any reference to the internal states of the CPU. The control signals are supplied via outputs $A_5$ to $A_7$, power applied to each individual LED or/and light bulb determining the light source to be illuminated and/or brightness, which can be varied by a signal on a corresponding control output. Many light sources, such as LED's or/and light bulbs, can be connected to a single output. FIG. 9b shows a connection of a group of LED's responsive to a single output. FIG. 9c shows a connection of a single light bulb and FIG. 9d shows a connection of a group of light bulbs responsive to a single output. Of course, mixed connections of light bulbs with LED's, or groups of both are possible. Also, while three LED or/and light bulb control outputs $A_5$ to $A_7$ and three LED's 34a, 34b and 34c are shown on FIG. 9a, a different number of outputs, LED's and light bulbs can be used. Separate LED or/and light bulb controllers can also be used.

To summarize, the inventive switch in its most basic form may use means for detecting the presence of an object and for generating a flag as a first data bit, a triac for delivering a delayed triac trigger pulse which is a second data bit used to control the power delivered by the switch and an AC zero detector for detecting an AC period zero crossing as a third data bit. Thus a switch with very few components and input/output pin connections can be provided resulting in a compact integral assembly.

The means for detecting is preferably a capacitive sensor, a central processing unit receiving and processing the first data bit relative to the AC period crossing bit to generate the delayed triac trigger pulse for controlling power supplied to the load. Alternatively, a relay can be used in place of the triac to issue an output as the second data bit for controlling circuit power.

A power supply circuit is readily incorporated as are various additional elements such as an A/D converter to convert the first data bit to a digital value, a differentiator to assure reaction only on capacitive changes, a comparator to confirm that the first data bit is large enough to overcome a threshold level, a control logic converter where the amount of power to be supplied as a function of the first data bit is calculated relative to the third data bit, among other components. Various algorithms can be incorporated in the central processing unit for determining the on/off character of the switch and/or dimming function.

Preferably, an air gap switch having a removable cover plate is used to halt power to the circuit. This can be used with other switches besides the one described herein. The air gap switch has a cover plate with means to engage a disconnect switch incorporated into the power supply circuit. The cover plate is mounted for movement such as sliding up or down to toggle a lever type disconnect switch, the cover plate having an arm for activating the lever, or is mounted for being pulled in or out to toggle a push button type of disconnect switch.

In addition, an inventive lighting system for use with cover plates may be integrated with the inventive switch, though that can also be used with other switches, other electrical components or even as a stand alone unit. This lighting system would incorporate a light supply, means to connect to a power source, a mounting assembly for supporting a light supply and the power source behind a cover plate and a controller for controlling the light supply such as turning the light supply on/off, initiating a particular sequences of lighting a single LED/Bulb or multiple light sources that compose the light supply, as well as the intensity of the light supply. This lighting system can be integrated with many different electrical components, or be integrated with a cover plate, or be a stand alone lighting product mounted in wall receptacles with or without electrical components. For example, these can provide an aesthetic effect such as for outlining a picture mounted on the wall or providing illumination through various cover plates visible across a room. The light supply can be responsive to power flow as discussed above, or produce a programmed lighting sequence or intensity to attract attention or be connected to external controllers for activating the switch and/or operation. For example, connection to a computer in a "smart" building may provide for activation at certain times of the day or when other lights are deactivated to provide a substitute for full room lighting, to act as a night light, emergency light, warning light, etc.

While preferred embodiments of the present invention have been shown and described, it will be understood by those skilled in the art that various changes or modifications can be made without varying from the scope of the present invention.

I claim:

1. A compact non-contact electrical switch for use in an electrical box mountable in a wall and having an electrical circuit passing therethrough comprising:

means for detecting a presence of an object adjacent to the switch and for generating an output signal;

a central processing unit connected to the presence detecting means and having means for receiving the output signal therefrom, and having signal processing means for calculating a power output in response to the output signal for generating a control signal for controlling power supplied to the electrical circuit; and an AC period zero cross detector and a triac in the electrical circuit and wherein the control signal is a delayed triac trigger pulse for controlling power supplied to the electrical circuit.

2. The switch of claim 1 wherein the detecting means is a capacitive sensor.

3. The switch of claim 1 further comprising a relay in the electrical circuit, wherein the control signal activates the relay for controlling power in the electrical circuit.

4. The switch of claim 1 further comprising an A/D converter to convert the output signal from the detecting means to a digital value.

5. The switch of claim 1 further comprising a differentiator for receiving the output signal and for transmitting the output signal only on a change in a presence before the switch.

6. The switch of claim 1 further comprising a comparator to compare the output signal to a threshold level for transmitting a first data bit only when the output signal exceeds the threshold level.

7. The switch of claim 1 wherein the signal processing means is a control logic converter where the amount of power to be supplied is determined as a function of the output signal.

8. The switch of claim 1 further comprising a delay counter synchronized with an AC period via an AC period zero cross detector, to generate a time delay after AC period zero crossing proportional to the output signal.

9. The switch of claim 1 wherein the control signal varies the power in the electrical circuit to provide a dimmer function.

10. The switch of claim 1 further comprising a power supply for the switch.

11. The switch of claim 10 wherein the power supply comprises a semiconductor element coupling a capacitor directly to a line voltage, such that when the line voltage is below a certain level, the capacitor is charged.

12. The switch of claim 11 further comprising a regulator connected to the capacitor to regulate the line voltage.

13. The switch of claim 1 further comprising an air gap switch engaged with the non-contact electrical switch, a movable cover plate engaged to the air gap switch for activating the air gap switch to halt power supply to the electrical circuit.

14. The switch of claim 13 wherein the cover plate has means to engage the air gap switch.

15. The switch of claim 13 wherein the cover plate is movable to toggle a lever disconnect switch, the cover plate having an arm for activating the lever.

16. The switch of claim 13 wherein the cover plate is movable for being pulled in or out to toggle a push button disconnect switch.

17. The switch of claim 1 further comprising means for lighting integrated with the switch.

18. A method for operating a device connected to an electrical circuit comprising:
    providing an electrical box located having the electrical circuit passing therethrough;
    providing a non-contact electrical switch in the electrical box and integrated with the electrical circuit, the switch having means for detecting a presence of an object adjacent to the switch and for generating a first data bit; a central processing unit connected to the presence detecting means and having means for receiving the data bit therefrom, and having signal processing means for calculating a power output in response to the first data bit and for generating a control signal for controlling power supplied to the electrical circuit; and
    using the control signal to vary the power in the electrical circuit, thereby providing a dimmer function.

19. A compact non-contact electrical switch for use in an electrical box mountable in a wall and having an electrical circuit passing therethrough comprising means for detecting a presence of an object adjacent to the switch and for generating an output signal;
    a central processing unit connected to the presence detecting means and having means for receiving the output signal therefrom, and having signal processing means for calculating a power output in response to the output signal for generating a control signal for controlling power supplied to the electrical circuit; and,
    a differentiator for receiving the output signal and for transmitting the output signal only on a change in a presence before the switch.

20. The switch of claim 19 wherein the detecting means is a capacitive sensor.

21. The switch of claim 19 further comprising a relay in the electrical circuit, wherein the control signal activates the relay for controlling power in the electrical circuit.

22. The switch of claim 19 further comprising an A/D converter to convert the output signal from the detecting means to a digital value.

23. The switch of claim 19 further comprising a comparator to compare the output signal to a threshold level for transmitting a first data bit only when the output signal exceeds the threshold level.

24. The switch of claim 19 wherein the signal processing means is a control logic converter where the amount of power to be supplied is determined as a function of the output signal.

25. The switch of claim 19 further comprising a delay counter synchronized with an AC period via an AC period zero cross detector, to generate a time delay after AC period zero crossing proportional to the output signal.

26. The switch of claim 19 wherein the control signal varies the power in the electrical circuit to provide a dimmer function.

27. The switch of claim 19 further comprising a power supply for the switch.

28. The switch of claim 27 wherein the power supply comprises a semiconductor element coupling a capacitor directly to a line voltage, such that when the line voltage is below a certain level, the capacitor is charged.

29. The switch of claim 28 further comprising a regulator connected to the capacitor to regulate the line voltage.

30. The switch of claim 19 further comprising an air gap switch engaged with the non-contact electrical switch, a movable cover plate engaged to the air gap switch for activating the air gap switch to halt power supply to the electrical circuit.

31. The switch of claim 30 wherein the cover plate has means to engage the air gap switch.

32. The switch of claim 30 wherein the cover plate is movable to toggle a lever disconnect switch, the cover plate having an arm for activating the lever.

33. The switch of claim 30 wherein the cover plate is movable for being pulled in or out to toggle a push button disconnect switch.

34. A compact non-contact electrical switch for use in an electrical box mountable in a wall and having an electrical circuit passing therethrough comprising:
    means for detecting a presence of an object adjacent to the switch and for generating an output signal;
    a central processing unit connected to the presence detecting means and having means for receiving the output signal therefrom, and having signal processing means for calculating a power output in response to the output signal for generating a control signal for controlling power supplied to the electrical circuit; and,
    a comparator to compare the output signal to a threshold level for transmitting a first data bit only when the output signal exceeds the threshold level.

35. The switch of claim 34 wherein the detecting means is a capacitive sensor.

36. The switch of claim 34 further comprising a relay in the electrical circuit, wherein the control signal activates the relay for controlling power in the electrical circuit.

37. The switch of claim 34 further comprising an A/D converter to convert the output signal from the detecting means to a digital value.

38. The switch of claim 34 wherein the signal processing means is a control logic converter where the amount of power to be supplied is determined as a function of the output signal.

39. The switch of claim 34 further comprising a delay counter synchronized with an AC period via an AC period zero cross detector, to generate a time delay after AC period zero crossing proportional to the output signal.

40. The switch of claim 34 wherein the control signal varies the power in the electrical circuit to provide a dimmer function.

41. The switch of claim 34 further comprising a power supply for the switch.

42. The switch of claim 41 wherein the power supply comprises a semiconductor element coupling a capacitor directly to a line voltage, such that when the line voltage is below a certain level, the capacitor is charged.

43. The switch of claim 42, further comprising a regulator connected to the capacitor to regulate the line voltage.

44. The switch of claim 34 further comprising an air gap switch engaged with the non-contact electrical switch, a movable cover plate engaged to the air gap switch for activating the air gap switch to halt power supply to the electrical circuit.

45. The switch of claim 44 wherein the cover plate has means to engage the air gap switch.

46. The switch of claim 44 wherein the cover plate is movable to toggle a lever disconnect switch, the cover plate having an arm for activating the lever.

47. The switch of claim 44 wherein the cover plate is movable for being pulled in or out to toggle a push button disconnect switch.

48. A compact non-contact electrical switch for use in an electrical box mountable in a wall and having an electrical circuit passing therethrough comprising:

means for detecting a presence of an object adjacent to the switch and for generating an output signal;

a central processing unit connected to the presence detecting means and having means for receiving the output signal therefrom, and having signal processing means for calculating a power output in response to the output signal for generating a control signal for controlling power supplied to the electrical circuit; and, a delay counter synchronized with an AC period via an AC period zero cross detector, to generate a time delay after AC period zero crossing proportional to the output signal.

49. The switch of claim 48, wherein the detecting means is a capacitive sensor.

50. The switch of claim 48 further comprising a relay in the electrical circuit, wherein the control signal activates the relay for controlling power in the electrical circuit.

51. The switch of claim 48 further comprising an A/D converter to convert the output signal from the detecting means to a digital value.

52. The switch of claim 48 wherein the signal processing means is a control logic converter where the amount of power to be supplied is determined as a function of the output signal.

53. The switch of claim 48 wherein the control signal varies the power in the electrical circuit to provide a dimmer function.

54. The switch of claim 48 further comprising a power supply for the switch.

55. The switch of claim 54 wherein the power supply comprises a semiconductor element coupling a capacitor directly to a line voltage, such that when the line voltage is below a certain level, the capacitor is charged.

56. The switch of claim 55 further comprising a regulator connected to the capacitor to regulate the line voltage.

57. The switch of claim 48 further comprising an air gap switch engaged with the non-contact electrical switch, a movable cover plate engaged to the air gap switch for activating the air gap switch to halt power supply to the electrical circuit.

58. The switch of claim 57 wherein the cover plate has means to engage the air gap switch.

59. The switch of claim 57 wherein the cover plate is movable to toggle a lever disconnect switch, the cover plate having an arm for activating the lever.

60. The switch of claim 57 wherein the cover plate is movable for being pulled in or out to toggle a push button disconnect switch.

61. A compact non-contact electrical switch for use in an electrical box mountable in a wall and having an electrical circuit passing therethrough comprising:

means for detecting a presence of an object adjacent to the switch and for generating an output signal;

a central processing unit connected to the presence detecting means and having means for receiving the output signal therefrom, and having signal processing means for calculating a power output in response to the output signal for generating a control signal for controlling power supplied to the electrical circuit, the switch of claim 1 wherein the control signal varies the power in the electrical circuit to provide a dimmer function.

62. The switch of claim 61 wherein the detecting means is a capacitive sensor.

63. The switch of claim 61 further comprising a relay in the electrical circuit, wherein the control signal activates the relay for controlling power in the electrical circuit.

64. The switch of claim 61 further comprising an A/D converter to convert the output signal from the detecting means to a digital value.

65. The switch of claim 61 wherein the signal processing means is a control logic converter where the amount of power to be supplied is determined as a function of the output signal.

66. The switch of claim 61 further comprising a power supply for the switch.

67. The switch of claim 66 wherein the power supply comprises a semiconductor element coupling a capacitor directly to a line voltage, such that when the line voltage is below a certain level, the capacitor is charged.

68. The switch of claim 67 further comprising a regulator connected to the capacitor to regulate the line voltage.

69. The switch of claim 61 further comprising an air gap switch engaged with the non-contact electrical switch, a movable cover plate engaged to the air gap switch for activating the air gap switch to halt power supply to the electrical circuit.

70. The switch of claim 69 wherein the cover plate has means to engage the air gap switch.

71. The switch of claim 69 wherein the cover plate is movable to toggle a lever disconnect switch, the cover plate having an arm for activating the lever.

72. The switch of claim 69 wherein the cover plate is movable for being pulled in or out to toggle a push button disconnect switch.

73. A compact non-contact electrical switch for use in an electrical box mountable in a wall and having an electrical circuit passing therethrough comprising:

means for detecting a presence of an object adjacent to the switch and for generating an output signal;

a central processing unit connected to the presence detecting means and having means for receiving the output signal therefrom, and having signal processing means for calculating a power output in response to the output signal for generating a control signal for controlling power supplied to the electrical; and a power supply for the switch comprising a semiconductor element coupling a capacitor directly to a line voltage, such that when the line voltage is below a certain level, the capacitor is charged.

74. The switch of claim 73 wherein the detecting means is a capacitive sensor.

75. The switch of claim 73 further comprising a relay in the electrical circuit, wherein the control signal activates the relay for controlling power in the electrical circuit.

76. The switch of claim 73 further comprising an A/D converter to convert the output signal from the detecting means to a digital value.

77. The switch of claim 73 further comprising a differentiator for receiving the output signal and for transmitting the output signal only on a change in a presence before the switch.

78. The switch of claim 73 further comprising a comparator to compare the output signal to a threshold level for transmitting a first data bit only when the output signal exceeds the threshold level.

79. The switch of claim 73 wherein the signal processing means is a control logic converter where the amount of power to be supplied is determined as a function of the output signal.

80. The switch of claim 73 further comprising a delay counter synchronized with an AC period via an AC period zero cross detector, to generate a time delay after AC period zero crossing proportional to the output signal.

81. The switch of claim 73 wherein the control signal varies the power in the electrical circuit to provide a dimmer function.

82. The switch of claim 73 further comprising a regulator connected to the capacitor to regulate the line voltage.

83. The switch of claim 73 further comprising an air gap switch engaged with the non-contact electrical switch, a movable cover plate engaged to the air gap switch for activating the air gap switch to halt power supply to the electrical circuit.

84. The switch of claim 83 wherein the cover plate has means to engage the air gap switch.

85. The switch of claim 83 wherein the cover plate is movable to toggle a lever disconnect switch, the cover plate having an arm for activating the lever.

86. The switch of claim 83 wherein the cover plate is movable for being pulled in or out to toggle a push button disconnect switch.

87. A compact non-contact electrical switch for use in an electrical box mountable in a wall and having an electrical circuit passing therethrough comprising:
means for detecting a presence of an object adjacent to the switch and for generating an output signal;
a central processing unit connected to the presence detecting means and having means for receiving the output signal therefrom, and having signal processing means for calculating a power output in response to the output signal for generating a control signal for controlling power supplied to the electrical circuit; and,
an air gap switch engaged with the non-contact electrical switch, a movable cover plate engaged to the air gap switch for activating the air gap switch to halt power supply to the electrical circuit.

88. The switch of claim 87 wherein the detecting means is a capacitive sensor.

89. The switch of claim 87 further comprising a relay in the electrical circuit, wherein the control signal activates the relay for controlling power in the electrical circuit.

90. The switch of claim 87 further comprising A/D converter to convert the output signal from the detecting means to a digital value.

91. The switch of claim 87 wherein the signal processing means is a control logic converter where the amount of power to be supplied is determined as a function of the output signal.

92. The switch of claim 87 further comprising a power supply for the switch.

93. The switch of claim 87 wherein the power supply comprises a semiconductor element coupling a capacitor directly to a line voltage, such that when the line voltage is below a certain level, the capacitor is charged.

94. The switch of claim 93 further comprising a regulator connected to the capacitor to regulate the line voltage.

95. The switch of claim 87 further comprising an air gap switch engaged with the non-contact electrical switch, a movable cover plate engaged to the air gap switch for activating the air gap switch to halt power supply to the electrical circuit.

96. The switch of claim 95 wherein the cover plate has means to engage the air gap switch.

97. The switch of claim 95 wherein the cover plate is movable to toggle a lever disconnect switch, the cover plate having an arm for activating the lever.

98. The switch of claim 95 wherein the cover plate is movable for being pulled in or out to toggle a push button disconnect switch.

99. A method for operating a device connected to an electrical circuit comprising:
providing an electrical box located having the electrical circuit passing therethrough;
providing a non-contact electrical switch in the electrical box and integrated with the electrical circuit, the switch having means for detecting a presence of an object adjacent to the switch and for generating a first data bit; a central processing unit connected to the presence detecting means and having means for receiving the data bit therefrom, and having signal processing means for calculating a power output in response to the first data bit and for generating a control signal for controlling power supplied to the electrical circuit comparing the output signal to a threshold level for transmitting the first data bit only when the output signal exceeds the threshold level;
placing an object adjacent to the switch for controlling an amount of power supplied to the electrical circuit; and,
removing the object when a selected amount of power is supplied to the electrical circuit.

100. The method of claim 99 wherein the means for detecting the presence of the object is a capacitive sensor.

101. The method of claim 99 further comprising providing an AC period zero cross detector and a triac and generating the control signal as a delayed triac trigger pulse.

102. The method of claim 99 further comprising receiving the output signal only on a change in the presence of the object adjacent to the switch.

103. The method of claim 99 further comprising providing a differentiator for receiving the output signal and for transmitting the output signal only on a change in a presence before the switch.

104. The method of claim 99 further comprising providing an air gap switch engaged with the non-contact electrical switch and a movable cover plate engaged to the air gap switch, and, activating the air gap switch to halt power supply to the electrical switch.

* * * * *